United States Patent [19]

Hashimoto

[11] Patent Number: 5,856,702
[45] Date of Patent: Jan. 5, 1999

[54] POLYSILICON RESISTOR AND METHOD OF PRODUCING SAME

[75] Inventor: Takasuke Hashimoto, Tokyo, Japan

[73] Assignee: NEC Corporation, Tokyo, Japan

[21] Appl. No.: 839,335

[22] Filed: Apr. 18, 1997

[30] Foreign Application Priority Data

Apr. 19, 1996 [JP] Japan ................................ 8-098340

[51] Int. Cl.$^6$ .................................................. H01L 29/00
[52] U.S. Cl. ..................... 257/538; 257/516; 257/534; 438/382
[58] Field of Search ..................... 257/528, 534, 257/536, 537, 538, 516, 622, 363, 359, 364; 438/171, 190, 210, 238, 330, 382

[56] References Cited

U.S. PATENT DOCUMENTS

| 5,352,923 | 10/1994 | Boyd et al. ........................... 257/536 |
| 5,382,549 | 1/1995 | Ohshima et al. ..................... 437/233 |
| 5,530,270 | 6/1996 | Takahashi et al. ................... 257/154 |
| 5,567,977 | 10/1996 | Jimenez ............................... 257/538 |

FOREIGN PATENT DOCUMENTS

| 57-88757 | 6/1982 | Japan . | |
| 363229744 | 9/1988 | Japan ............................ 257/538 |
| 63-229744 | 9/1988 | Japan . | |
| 363293871 | 11/1988 | Japan ............................ 257/538 |
| 404099366 | 3/1992 | Japan ............................ 257/538 |
| A-4-99366 | 3/1998 | Japan . | |

Primary Examiner—Valencia Wallace
Assistant Examiner—George C. Eckert, II
Attorney, Agent, or Firm—Foley & Lardner

[57] ABSTRACT

The invention relates to a polysilicon resistor made by forming a film of polysilicon doped with an impurity on a dielectric film on a semiconductor substrate and patterning the polysilicon film. An object of the invention is to provide a polysilicon resistor which has a low resistance value and occupies a small area. A slot is formed in the dielectric film and is filled with the polysilicon film. The dielectric film and the patterned polysilicon film are overlaid with a second dielectric film, and a pair of contact windows are opened in the second dielectric film such that each contact window is partly over an end section of the slot. A plurality of parallel slots can be formed in the first dielectric film to further lower the resistance value or to further reduce the area of the patterned polysilicon film. As an alternative, at least one slot is formed in the substrate and is filled with a polysilicon film after depositing a dielectric film on the substrate surface including the surfaces in the slot(s).

10 Claims, 5 Drawing Sheets

POLYSILICON RESISTOR AND METHOD OF PRODUCING SAME

BACKGROUND OF THE INVENTION

This invention relates to a polycrystalline silicon (polysilicon) resistor which is useful as a low resistance resistor in semiconductor integrated circuits and a method of producing the resistor.

In conventional semiconductor integrated circuits, resistors are usually made by patterning a planar and homogeneous film of polysilicon which is deposited on a dielectric film and is doped with an impurity such as phosphorus or boron.

In the accompanying drawings, FIGS. 8 and 9 show a conventional polysilicon resistor. A dielectric film 52 is formed on a semiconductor substrate 50, and a rectangular pattern of a doped polysilicon film 54 is formed on the dielectric film 52. The dielectric film 52 and the polysilicon film 54 are overlaid with another dielectric film 56. A pair of contact windows 60 are opened in the dielectric film 56, and aluminum contacts 62 are provided by using the contact windows 60. The resistance (R) of this resistor depends on the dopant concentration in the polysilicon film 54 and the dimensions of the patterned polysilicon film, the thickness (D), width (W) and the effective length (L). The resistance R is given by the equation (1).

$$R = \rho L/WD = \rho_s L/W \tag{1}$$

where $\rho$ is the resistivity of the film 54, and $\rho_s$ is the sheet resistance of the film 54.

To increase the resistance R, it is conceivable to enhance the resistivity of the polysilicon film by lowering the dopant concentration. However, if the polysilicon film is very lightly doped, the temperature dependence of the resistivity is substantially increased. The resistance R can be increased by increasing the length L of the resistor, but in this case the resistor occupies an increased area.

JP-A 63-229744 (1988) shows a polysilicon resistor which can have a high resistance value without increasing the resistor area. FIGS. 10 and 11 of the accompanying drawings show a resistor according to JP-A 63-229744. A dielectric film 52 is formed on a semiconductor substrate 50, and slots 58 in a parallel arrangement are formed in the dielectric film 52 by anisotropic etching. A polysilicon film 54 is deposited on the dielectric film 52 including the dielectric surfaces in the slots 58, and an impurity is introduced into the polysilicon film 54. The doped polysilicon film 54 is selectively etched to form a rectangular resistor pattern which traverses the slots 58. After that, another dielectric film 56 is deposited over the dielectric film 52 and the polysilicon film 54, and contact windows 60 for aluminum contacts 62 are opened in the dielectric film 56. In this resistor, the effective length of the polysilicon film is increased by using the surfaces in the slots 58 instead of increasing the distance between the two contacts 62.

To lower the resistance R of a polysilicon resistor, the resistivity of the polysilicon film is lowered by increasing the dopant concentration in the film. However, there is a limit to the lowering of resistivity by this method because when the dopant concentration exceeds the solid solubility limit the excess dopant segregates at the grain boundaries. Also there is a limit to shortening of the effective length of the patterned polysilicon film since the possible minimum length is determined by the resolution of photolithography for patterning the contact windows 60 in FIG. 8. It is undesirable to enlarge the width of the patterned polysilicon film because the resistor occupies an increased area.

JP-A 57-88757 (1982) shows a method of transforming a polysilicon film into a single crystal silicon film in producing a conductor pattern including a resistor region and interconnect regions. One reason for this transformation is that the single crystal silicon film provides much lower in resistivity than the polysilicon film.

FIG. 12 of the accompanying drawings illustrates an example in JP-A 57-88757. A dielectric film 74 is formed on a p-type silicon substrate 70 in which n-type regions 72 are formed. Contact windows 78 and a number of parallel grooves 76 are formed in the dielectric film 74. A polysilicon film 80 is deposited on the dielectric film 74 so as to fill the grooves 76 and contact windows 78, and the polysilicon film is patterned by photolithography and subsequent etching to form a pattern including a resistor region 80a, interconnect regions 80b and contact regions 80c. Then, an impurity is introduced into the polysilicon film 80 by ion implantation. In the resistor region 80a the impurity concentration is regulated according to the aimed resistance value. In the interconnect regions 80b and contact regions 80c the impurity concentration is made higher so as to slightly exceed the solid solubility limit. After that, the resistor region 80a and interconnect regions 80b of the doped polysilicon film are irradiated with a high-density energy beam such as a laser beam or an electron beam to activate the implanted impurity and to transform polysilicon in these regions 80a, 80b into single crystal silicon. At this stage the grooves 76 provide artificial nuclei for crystal growth. In consequence, the resistor region 80a of the silicon film is transformed into a relatively high resistance region of single crystal silicon film, and the interconnect regions 80b are transformed into low resistivity regions of single crystal silicon film. In the contact regions 80c, the low resistivity polysilicon film remains unchanged.

The method according to JP-A 57-88757 may be used to produce a silicon resistor having a very low resistance value. However, from a practical point of view this method is not favorable because of the intricacy of irradiating the polysilicon film with a high-density energy beam.

SUMMARY OF THE INVENTION

It is an object of the present invention to provide a polysilicon resistor that has a relatively low resistance value and occupies a relatively small area, and that can be produced without employing any special technique.

It is another object of the invention to provide a method of producing a polysilicon resistor in accordance with the aforementioned object.

A polysilicon resistor according to the invention comprises a semiconductor substrate, a first dielectric film formed on the substrate, a resistor pattern of a polysilicon film which is deposited on the first dielectric film and is doped with an impurity, a slot which is formed in the first dielectric film under the resistor pattern and is filled with the polysilicon film, the polysilicon thereby providing a resistive element having a T-shaped cross section, a second dielectric film deposited on the first dielectric film and the resistor pattern, and a pair of contact windows which are opened in the second dielectric film on the resistor pattern to define the effective length of the resistor pattern. Each of the contact windows is opened in an area which partly overlaps an area over an end section of the slot.

For producing a polysilicon resistor, a method according to the invention comprises the steps of (a) forming a first dielectric film on a semiconductor substrate, (b) forming a slot in the first dielectric film, (c) forming a polysilicon film doped with an impurity on the first dielectric film so as to fill the slot with the polysilicon film, (d) patterning the polysilicon film to form a resistor pattern on the first dielectric film in an area containing the slot, (e) depositing a second dielectric film on the first dielectric film and the resistor pattern, and (f) opening a pair of contact windows in the second dielectric film on the resistor pattern such that each contact window is partly over an end section of the slot. The slot can be formed by anisotropic etching preceded by photolithography.

In this invention, a slot under the polysilicon film is filled with the polysilicon film for the purpose of increasing the effective thickness of the polysilicon film without thickening the polysilicon film on the top surface of the dielectric film. In consequence, the resistance value of the resistor can be lowered without enlarging the width and area of the patterned polysilicon film. For a given resistance value, the area of the patterned polysilicon film can be reduced.

The merits of the invention can be augmented by forming a plurality of parallel slots in the first dielectric film and by filling all the slots with the polysilicon film, thereby providing a resistive element having multiple T-shaped cross sectioned portions.

As an alternative to the slot(s) in the first dielectric film, it is possible to form a slot or a plurality of parallel slots in the semiconductor substrate. After forming the slot(s) in the substrate, a first dielectric film is deposited on the substrate surface including the surfaces in the slot(s). Then the polysilicon film is deposited on the first dielectric film so as to fill the slot(s) in the substrate.

DESCRIPTION OF THE PREFERRED EMBODIMENTS

Figure 1:
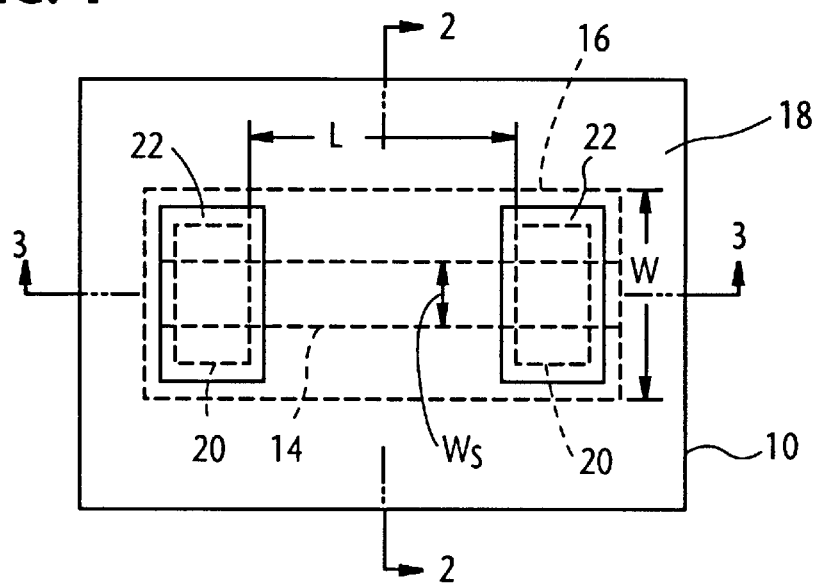
FIG. 1 is a plan view of a polysilicon resistor according to the invention.
Figure 2:
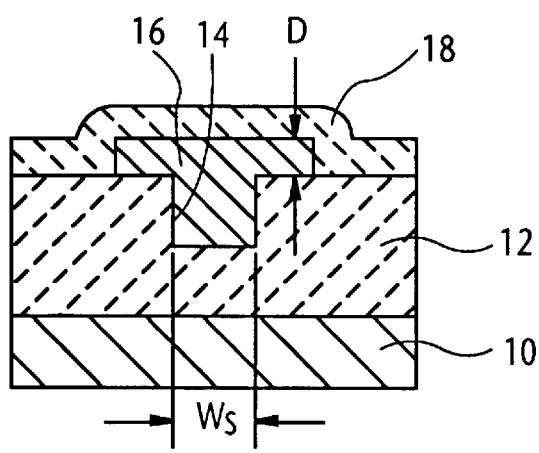
FIGS. 2 and 3 are schematic sectional views taken along the line 2—2 and line 3—3 in FIG. 1, respectively.
Figure 3:
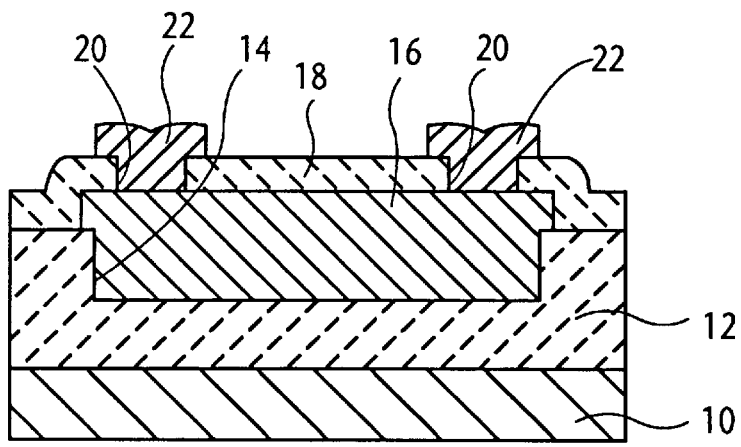

FIGS. 1–3 illustrate a first embodiment of the invention.

A dielectric film 12 such as, for example, a silicon oxide film is formed on a semiconductor substrate 10 such as a silicon substrate. On the dielectric film 12 there is a polysilicon film 16 which is doped with an impurity such as phosphorus, boron or arsenic. To make a resistor, the polysilicon film 16 is patterned into a rectangular shape. Under the rectangular pattern of the polysilicon film 16, a slot 14 is formed in the dielectric film 12 so as to extend in the direction of the length of the resistor. The depth of the slot 14 is smaller than the thickness of the dielectric film 12, and the slot 14 is filled with the polysilicon film 16 deposited on the dielectric film 12 thereby providing a resistive element that has a T-shaped cross section. To completely fill the slot 14, the thickness D of the polysilicon film 16 is not smaller than ½ of the width $W_s$ of the slot 14. For example, when the slot width $W_s$ is 0.4 $\mu$m the film thickness D is 0.2 $\mu$m or greater. The dielectric film 12 and the polysilicon film 16 are overlaid with another dielectric film 18 such for example, a silicon nitride film. A pair of contact windows 20 are opened in the dielectric film 18 over the polysilicon film 16 in areas near the two opposite ends of the rectangular pattern of the polysilicon film 16. Each contact window 20 exposes the polysilicon film 16 in a relatively small rectangular area which traverses the slot 14 in the dielectric film 12. A pair of metal contacts 22 such as aluminum contacts are provided to the resistor (polysilicon film 16) by using the contact windows 20.

The resistor of FIGS. 1–3 is produced by the following process.

Figure 4A:
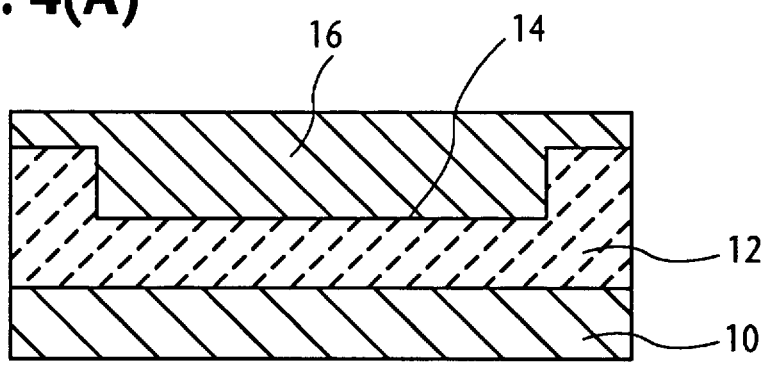
FIGS. 4(A) to 4(C) illustrate a process of =producing the resistor of FIGS. 1–3 in schematic sectional views.

Referring to FIG. 4(A), the dielectric film 12 is formed on the semiconductor substrate 10, and the slot 14 is formed in the dielectric film 12 by anisotropic etching such as reactive ion etching (RIE) preceded by photolithography. Then, by a chemical vapor deposition (CVD) process, a polysilicon film 16 is deposited over the whole area of the dielectric film 12 such that the slot 14 is completely filled with the deposited polysilicon 16. The polysilicon film 16 needs to be doped with an impurity. It is preferable to accomplish doping during deposition by adding a dopant gas to the reaction gases to deposit polysilicon. However, it is another option to introduce an impurity into an undoped polysilicon film by ion implantation or by diffusion.

Figure 4B:
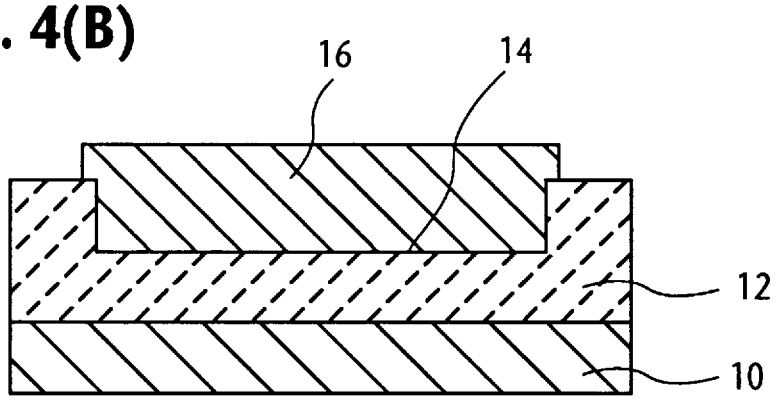

Referring to FIG. 4(B), the doped polysilicon film 16 is patterned into a rectangular shape as shown in FIG. 1 by etching preceded by photolithography.

Figure 4C:
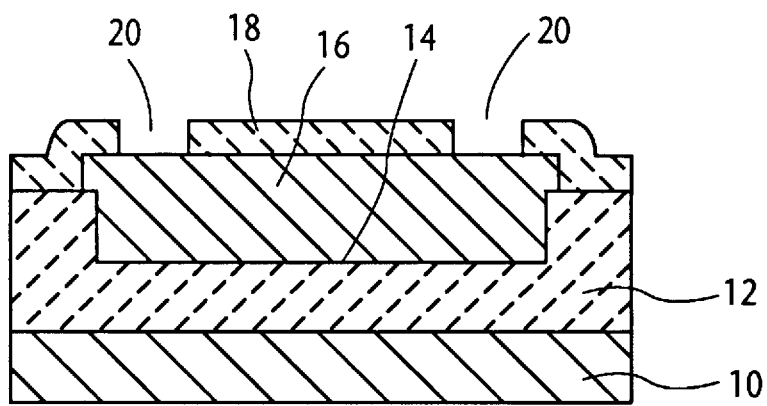

Referring to FIG. 4(C), the dielectric film 18 is deposited over the whole areas of the dielectric film 12 and the patterned polysilicon film 16, and the contact windows 20 are opened in the dielectric film 18 by etching preceded by photolithography.

The polysilicon 16 in the slot 14 serves the purpose of increasing the effective thickness of the polysilicon resistor without thickening the polysilicon film 16 over the top surface of the dielectric film 12. Consequently, the resistance of the resistor can be lowered without enlarging the width W of the patterned polysilicon film 16.

For example, the slot 14 is 0.4 $\mu$m in depth and 0.4 $\mu$m in width; the polysilicon film 16 is 0.2 $\mu$m in thickness (D); the sheet resistance of the 0.2 $\mu$m thick polysilicon film is 100$\Omega$/□; and the effective length (L) of the polysilicon film 16 is 0.5 $\mu$m (0.5 $\mu$m is the minimum distance between the two contact windows 20 that can accurately be defined by photolithography). Then, the resistance value of the resistor depends on the width (W) of the polysilicon film 16. It is assumed that the aimed resistance value is 10$\Omega$.

Figure 8:
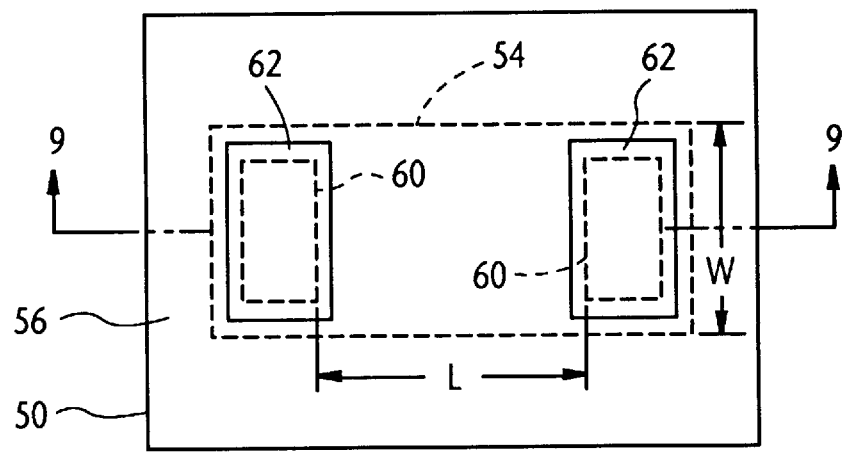
FIG. 8 is a plan view of a conventional polysilicon resistor.
Figure 9:
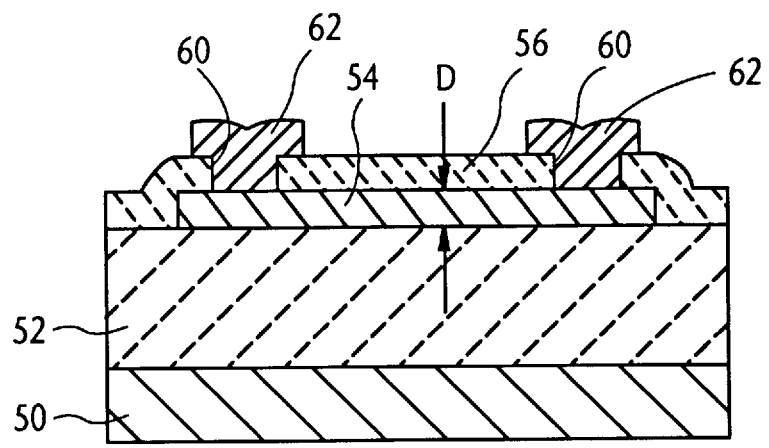
FIG. 9 is a sectional view taken along the line 9—9 in FIG. 8.
Figure 10:
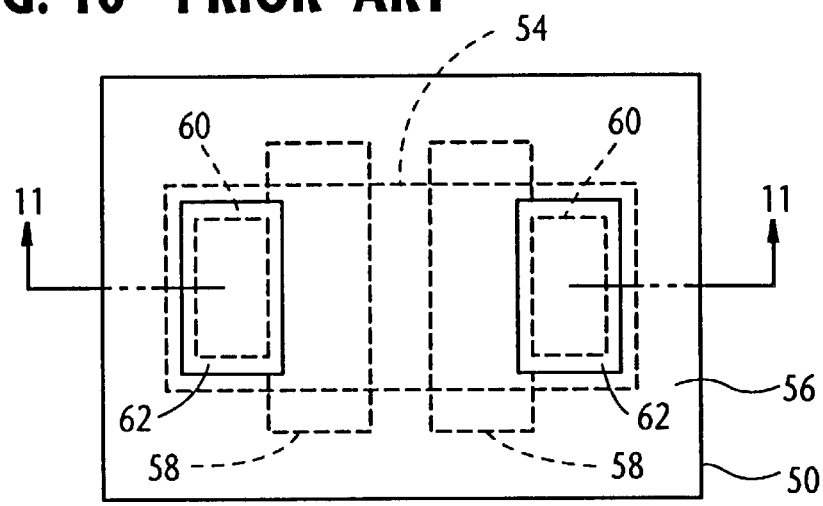
FIG. 10 is a plan view of a polysilicon resistor proposed prior to the present invention.
Figure 11:
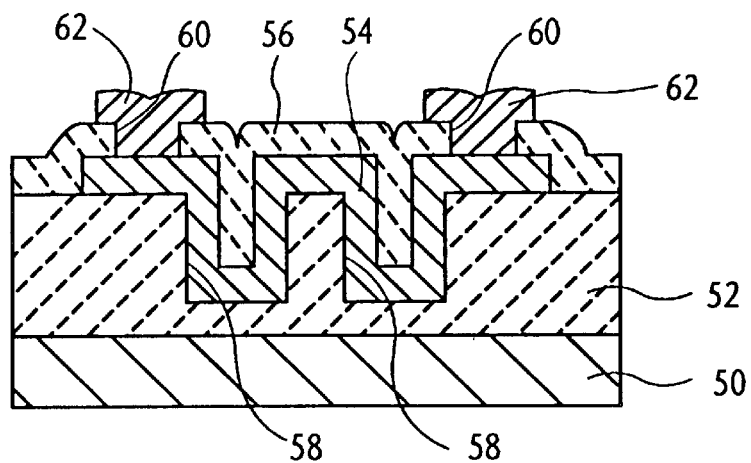
FIG. 11 is a sectional view taken along the line 11—11 in FIG. 10.
Figure 12:
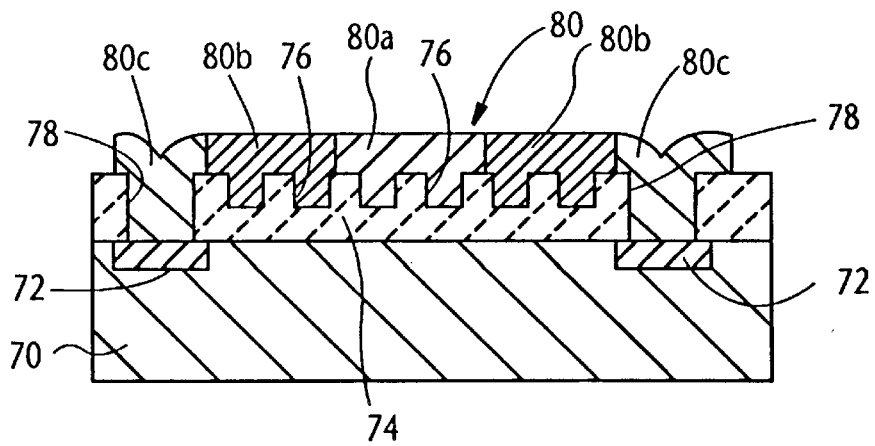
FIG. 12 is a schematic sectional view of a single crystal silicon resistor proposed prior to the present invention.

In the case of the conventional polysilicon resistor shown in FIGS. 8 and 9, the width W of the polysilicon film 54 is given by the equation (2).

$$W = \rho_s L / R \tag{2}$$

So, in this case W is (100×0.5)/10=5 $\mu$m. Therefore, the polysilicon film 54 between the two contact windows 60 has an area of 5×0.5=2.5 $\mu$m$^2$.

In the case of the polysilicon resistor according to the invention shown in FIGS. 1–3, polysilicon in the slot 14 has a resistance $R_1$, and polysilicon above the top surface of the dielectric film 12 has a resistance $R_2$. The resistance $R_1$ is given by the equation (1').

$$R_1 = \rho_s L / W_s \tag{1'}$$

So $R_1$ is (50×0.5)/0.4=62.5$\Omega$.

The resistance $R_2$ can be found from the equation (3).

$$1/R_2 = 1/R - 1/R_1 = (R_1 - R)/RR_1 \quad (3)$$

So, $R_2$ is $625/52.5\Omega$.

The width W of the polysilicon film 16 is given by the equation (2').

$$W = \rho_s L/R_2 \quad (2')$$

So, W is $(100 \times 0.5)/(625/52.5) = 4.2\,\mu m$. Therefore, the polysilicon film 16 between the two contact windows 20 has an area of $(4.2 \times 0.5) = 2.1\,\mu m^2$. Compared with the area of 2.5 $\mu m^2$ in the conventional polysilicon resistor, a 16% reduction in area is accomplished.

Figure 7:
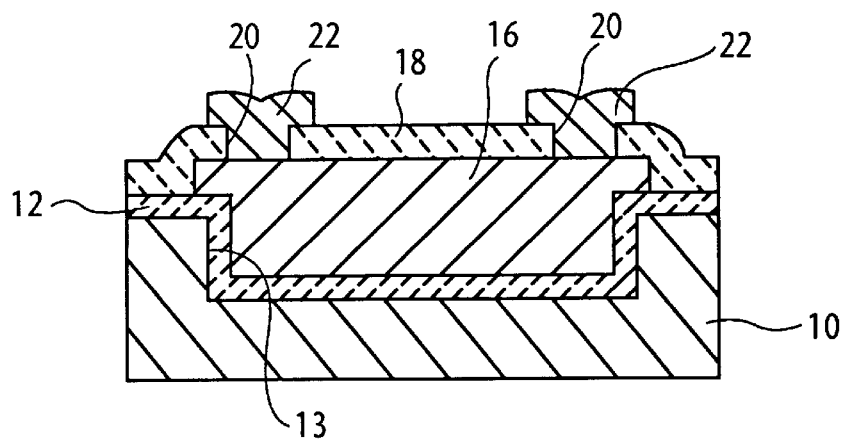
FIG. 7 shows a modification of the resistor of FIGS. 1–3 in a schematic sectional view.

As a modification of the first embodiment, it is possible to form a slot in the substrate 10 instead of forming the slot 14 in the dielectric film 12. FIG. 7 shows this modification in a sectional view corresponding to FIG. 3. In the substrate 10 a slot 13 is formed in the same arrangement as the slot 14 in FIGS. 1–3. Then a relatively thin dielectric film 12 is deposited on the substrate surface including the surfaces in the slot 13. Next, a polysilicon film 16 is deposited on the dielectric film 12 so as to fill the slot 13. Except these changes, the resistor of FIG. 7 is similar to the resistor shown in FIGS. 1–3.

Figure 5:
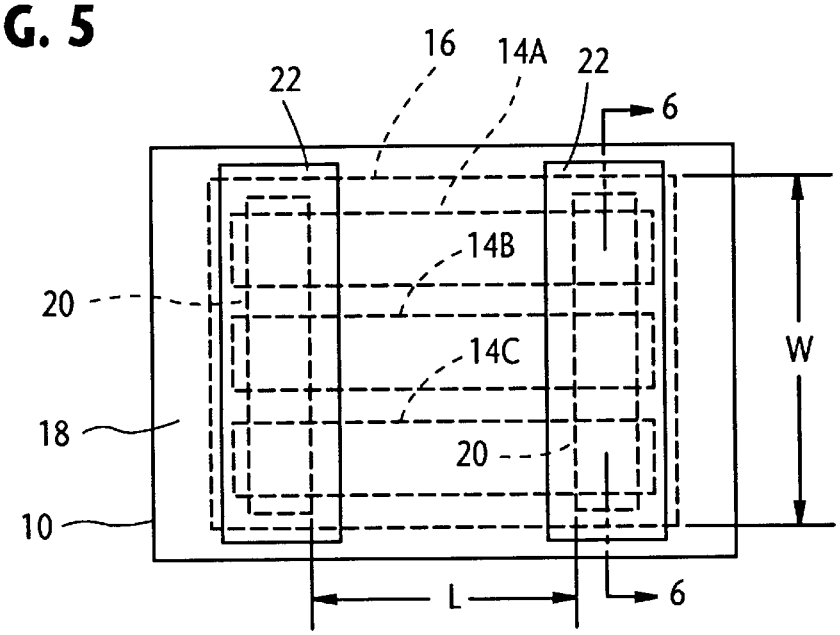
FIG. 5 is a plan view of another polysilicon resistor according to the invention.
Figure 6:
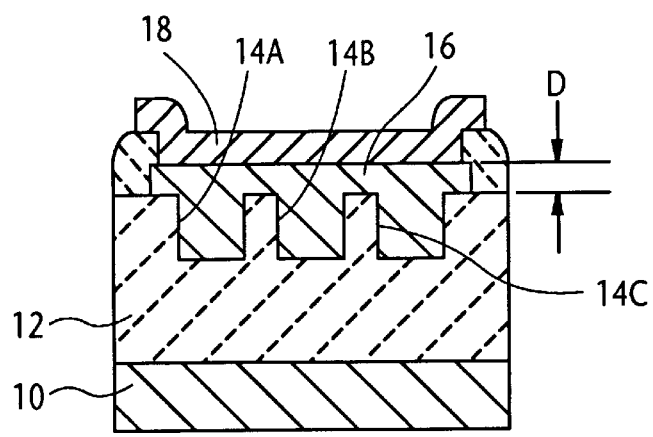
FIG. 6 is a schematic sectional view taken along the line 6—6 in FIG. 5.

FIGS. 5 and 6 show another embodiment of the invention. In this case, three slots 14A, 14B, 14C are formed in the dielectric film 12. These slots 14A, 14B, 14C are parallel to each other and extend in the direction of the length of the resistor. The slots 14A, 14B, 14C are all filled with the polysilicon film 16 deposited on the dielectric film 12 thereby providing a resistive element comprised of multiple T-shaped cross sectioned portions that are joined at their upper portions. The thickness of the polysilicon film 16 is not smaller than ½ of the width of the slots 14A, 14B, 14C. The three slots 14A, 14B, 14C may be different in width, and in that case the thickness of the polysilicon film 16 is not smaller than ½ of the width of the widest slot. An impurity is introduced into the polysilicon film during or after deposition. After patterning the polysilicon film 16 to form a rectangular resistor pattern over an area containing the three slots 14A, 14B, 14C, the dielectric film 12 and the polysilicon film 16 are overlaid with another dielectric film 18, and contact windows 20 are opened in the dielectric film 18 in rectangular areas which traverse the three slots 14A, 14B, 14C under the polysilicon film 16.

In contrast to the first embodiment shown in FIGS. 1–3 wherein a single slot 14 is used, this embodiment uses three slots 14A, 14B, 14C for the purpose of further reducing the resistor area, or for the purpose of further lowering the resistance without varying the resistor area.

For example, the slots 14A, 14B, 14C are $0.4\,\mu m$ in depth and $0.4\,\mu m$ in width; the polysilicon film 16 is $0.2\,\mu m$ in thickness; the sheet resistance of the $0.2\,\mu m$ thick polysilicon film is $100\Omega/\square$; and the distance between the two contact windows 20 is $0.5\,\mu m$. It is assumed that the aimed resistance value is $10\Omega$. Then, the width W of the patterned polysilicon film 16 becomes $2.6\,\mu m$. So, the area of the polysilicon film 16 between the two contact windows 20 is $2.6 \times 0.5 = 1.3\,\mu m^2$. Compared with the first embodiment shown in FIGS. 1–3 wherein the area in question is $2.1\,\mu m^2$, the resistor area is reduced by 38%. Compared with the conventional resistor shown in FIGS. 8 and 9 wherein the area in question is $2.5\,\mu m^2$, the resistor area is reduced by 48%.

In this invention an arbitrary number of slots can be used, and the merits of the invention can be augmented by increasing the number of the slots as much as possible.

What is claimed is:

1. A resistor, comprising:

a semiconductor substrate;

a first dielectric film formed on the substrate, the dielectric film having an upper surface and a slot formed therein;

a doped polysilicon resistive element formed on the first dielectric film and having an upper surface, the resistive element occupying the slot of the first dielectric film and extending over the upper surface of the first dielectric film to have a T-shaped cross section comprising a slot portion and an upper portion;

a second dielectric film formed over the resistive element and the first dielectric film; and a pair of contacts formed through the second dielectric film at respective ends of the resistive element defining an effective length of the resistive element, each of the contacts having a width greater than the width of the slot portion of the resistive element.

2. The resistor claimed in claim 1, wherein thickness of the upper portion of the resistive element is not less than ½ of width of the slot portion of the resistive element.

3. The resistor claimed in claim 1, wherein an upper surface of the upper portion of the resistive element is rectangular.

4. The resistor claimed in claim 1, wherein each of the contacts occupies a rectangular contact window formed in the second dielectric film.

5. The resistor claimed in claim 1, wherein the semiconductor substrate has a slot formed therein, and wherein the first dielectric film conforms to surfaces of the slot of the semiconductor substrate to thereby provide the slot of the first dielectric film.

6. A resistor, comprising:

a semiconductor substrate;

a first dielectric film formed on the substrate, the dielectric film having an upper surface and at least two slots formed therein;

a doped polysilicon resistive element formed on the first dielectric film and having an upper surface, the resistive element occupying the at least two slots of the first dielectric film and extending over the upper surface of the first dielectric film to have multiple T-shape cross sectioned portions, each comprising a slot portion and an upper portion, that are joined at their upper portions;

a second dielectric film formed over the resistive element and the first dielectric film; and a pair of contacts formed through the second dielectric formed at respective ends of the resistive element defining an effective length of the resistive element, each of the contacts overlapping outermost edges of outermost slot portions of the resistive element.

7. The resistor claimed in claim 6, wherein thickness of the upper portion of the resistive element is not less than ½ of width of the slot portions of the resistive element.

8. The resistor claimed in claim 6, wherein an upper surface of the upper portion of the resistive element is rectangular.

9. The resistor claimed in claim 6, wherein each of the contacts occupies a rectangular contact window formed in the second dielectric film.

10. The resistor claimed in claim 6, wherein the semiconductor substrate has at least two slots formed therein, and wherein the first dielectric film conforms to surfaces of the at least two slots of the semiconductor substrate to thereby provide the at least two slots of the first dielectric film.

* * * * *